(12) United States Patent
Kim et al.

(10) Patent No.: US 9,722,195 B2
(45) Date of Patent: Aug. 1, 2017

(54) DISPLAY DEVICE

(71) Applicant: Samsung Display Co., Ltd., Yongin-si, Gyeonggi-do (KR)

(72) Inventors: Tae Woong Kim, Yongin-si (KR); Hyun Woo Koo, Hwaseong-si (KR); Young Gug Seol, Hwaseong-si (KR)

(73) Assignee: Samsung Display Co., Ltd., Gyeonggi-Do (KR)

( * ) Notice: Subject to any disclaimer, the term of this patent is extended or adjusted under 35 U.S.C. 154(b) by 0 days.

(21) Appl. No.: 15/256,298

(22) Filed: Sep. 2, 2016

(65) Prior Publication Data

US 2016/0372691 A1 Dec. 22, 2016

Related U.S. Application Data

(63) Continuation of application No. 14/158,565, filed on Jan. 17, 2014, now Pat. No. 9,437,830.

(30) Foreign Application Priority Data

Aug. 12, 2013 (KR) .................. 10-2013-0095579

(51) Int. Cl.
*H01L 51/00* (2006.01)
*H01J 1/62* (2006.01)
*H01L 27/32* (2006.01)
*H01L 27/12* (2006.01)
*H05K 1/02* (2006.01)

(52) U.S. Cl.
CPC ...... *H01L 51/0097* (2013.01); *H01L 27/1244* (2013.01); *H01L 27/3258* (2013.01); *H01L 27/3276* (2013.01); *H01L 2251/5338* (2013.01); *H05K 1/0277* (2013.01); *Y02E 10/549* (2013.01)

(58) Field of Classification Search
CPC ............ H01L 51/0097; H01L 27/1244; H01L 27/3276; H05K 1/0277
USPC ............................ 257/40; 438/161; 313/498
See application file for complete search history.

(56) References Cited

U.S. PATENT DOCUMENTS

| | | | |
|---|---|---|---|
| 2002/0149054 A1 | 10/2002 | So et al. | |
| 2004/0124770 A1 | 7/2004 | Hayashi et al. | |
| 2007/0105288 A1 | 5/2007 | Miyairi et al. | |
| 2010/0136743 A1 | 6/2010 | Akimoto et al. | |
| 2010/0213819 A1 | 8/2010 | Cok et al. | |
| 2013/0148312 A1* | 6/2013 | Han .................. | H05K 7/00 361/736 |
| 2014/0138637 A1* | 5/2014 | Yang ................. | H01L 27/1218 257/40 |
| 2014/0217373 A1 | 8/2014 | Youn et al. | |

(Continued)

FOREIGN PATENT DOCUMENTS

| | | |
|---|---|---|
| CN | 1499908 A | 5/2004 |
| CN | 1215567 C | 8/2005 |
| CN | 1901220 A | 1/2007 |

(Continued)

*Primary Examiner* — David Vu
*Assistant Examiner* — Brandon Fox
(74) *Attorney, Agent, or Firm* — Knobbe Martens Olson & Bear LLP

(57) ABSTRACT

A display device is disclosed. In one aspect, the display device includes a flexible substrate capable of being bent in a first direction and an insulating layer including a first opening pattern positioned on the flexible substrate and extending in a second direction crossing the first direction.

22 Claims, 10 Drawing Sheets

(56) References Cited

U.S. PATENT DOCUMENTS

2014/0217397 A1    8/2014   Kwak et al.
2015/0036300 A1    2/2015   Park et al.

FOREIGN PATENT DOCUMENTS

| CN | 101009316 A | 8/2007 |
|---|---|---|
| JP | 2008-112112 A | 5/2008 |
| KR | 10-2002-0001512 A | 1/2002 |
| KR | 10-2012-0110777 A | 10/2012 |
| KR | 10-2012-0122043 A | 11/2012 |
| KR | 10-2013-0029040 A | 3/2013 |
| WO | WO 2011/108533 A1 | 9/2011 |

\* cited by examiner

1008

DISPLAY DEVICE

CROSS-REFERENCE TO RELATED APPLICATIONS

This application is a continuation of U.S. patent application Ser. No. 14/158,565 filed on Jan. 17, 2014, which claims priority to and the benefit of Korean Patent Application No. 10-2013-0095579, filed on Aug. 12, 2013, in the Korean Intellectual Property Office, each disclosure of which is incorporated herein in its entirety by reference.

BACKGROUND

Field

The described technology generally relates to a display device, and more particularly, to a display device including a flexible substrate.

Description of the Related Technology

Organic light-emitting diode (OLED) displays have recently attracted attention due to their unique characteristics.

OLED displays have self emissive characteristics and do not require a separate light source, in contrast to liquid crystal displays (LCDs). Consequently, OLED displays can have a reduced thickness and weight. Further, OLED displays include high quality characteristics such as low power consumption, high luminance, and high response speeds.

In general, OLED displays include a substrate, a plurality of thin film transistors formed on the substrate, a plurality of insulating layers formed between wires of the thin film transistors, and OLEDs connected to the thin film transistors.

Recently, flexible OLED displays have been developed and typically include a flexible substrate made of a polymer material so that the OLED displays can be bent.

The above information disclosed in this Background section is only intended to facilitate the understanding of the background of the described technology and therefore it may contain information that does not constitute the prior art that is already known in this country to a person of ordinary skill in the art.

SUMMARY OF CERTAIN INVENTIVE ASPECTS

One inventive aspect is a display device including a flexible substrate, in which stress generated in an insulating layer is minimized when the flexible substrate is bent.

Another aspect is a display device, including a flexible substrate capable of being bent in a first direction and an insulating layer including a first opening pattern positioned on the flexible substrate and extending in a second direction crossing the first direction.

The first opening patterns may include a plurality of first opening patterns, and the first opening patterns may be spaced apart from each other in the first direction.

The display device further includes a plurality of pixels positioned on the flexible substrate and configured to display an image and the first opening pattern is formed between adjacent pixels.

The pixel may include an OLED positioned on the flexible substrate a first thin film transistor connected to the OLED, and at least one second thin film transistor connected to the first thin film transistor.

The OLED may include a first electrode connected to the first thin film transistor, an organic light emission layer positioned on the first electrode, and a second electrode positioned on the organic light emission layer.

The first thin film transistor may include a first active layer positioned on the flexible substrate, a first gate electrode positioned on the first active layer, and a first source electrode and a first drain electrode connected to the first active layer.

The display device may further include a first scan line extending in the second direction on the flexible substrate, a second scan line spaced apart from the first scan line and extending in the second direction, an initialization power line spaced apart from the second scan line and extending in the second direction, a light emission control line spaced apart from the initialization power line and extending in the second direction, a data line extending in the first direction on the flexible substrate, and a driving power line spaced apart from the data line and extending in the first direction.

The other thin film transistor may include a second thin film transistor including a second gate electrode connected to the first scan line and configured to connect the data line to the first thin film transistor, a third thin film transistor including a third gate electrode connected to the first scan line and configured to connect the first drain electrode to the first gate electrode, a fourth thin film transistor including the fourth gate electrode connected to the second scan line and configured to connect the initialization power line to the first gate electrode, a fifth thin film transistor including a fifth gate electrode connected to the light emission control line and configured to connect the driving power line to the first thin film transistor, and a sixth thin film transistor including a sixth gate electrode connected to the light emission control line and configured to connect the first thin film transistor to the OLED.

The insulating layer may further include a first sub-insulating layer positioned between the flexible substrate and the first active layer.

The first opening pattern may be formed in the first sub-insulating layer.

The insulating layer may further include a second sub-insulating layer covering the first active layer.

The first opening pattern may be formed in the second sub-insulating layer.

The first opening pattern may be formed in the first and second sub-insulating layers.

The insulating layer may further include a third sub-insulating layer covering the first gate electrode.

The first opening pattern may be formed in the third sub-insulating layer.

The first opening pattern may be formed in the second and third sub-insulating layers.

The first opening pattern may be formed in the first, second, and third sub-insulating layers.

The pixel may have a substantially rectangular shape and the second direction may be substantially parallel to a long side of the pixel.

The pixel may have a substantially rectangular shape and the second direction may be substantially parallel to a short side of the pixel.

The insulating layer may further include a second opening pattern extending in the first direction and crossing the first opening pattern and the flexible substrate is capable of being bent in the second direction.

The first opening patterns may include a plurality of first opening patterns, the second opening patterns may include a plurality of second opening patterns, the first opening patterns may be spaced apart from each other in the first direction, and the second opening patterns may be spaced apart from each other in the second direction.

The first and second opening patterns may be formed in a substantially mesh shape.

The display device may further include a plurality of pixels positioned on the flexible substrate in which each of the pixels is surrounded by intersections between the first and second opening patterns.

The flexible substrate may have a substantially rectangular shape and the first direction may be substantially parallel to a long side or a short side of the flexible substrate.

The insulating layer may be formed of an inorganic material.

The inorganic material may include a nitride or an oxide.

The insulating layer may be formed of an organic material.

The organic material may include phenylene or siloxane.

According to at least one embodiment, the display device including a flexible substrate may minimize stress generated in an insulating layer when the flexible substrate is bent.

DETAILED DESCRIPTION OF CERTAIN INVENTIVE EMBODIMENTS

Figure 1:
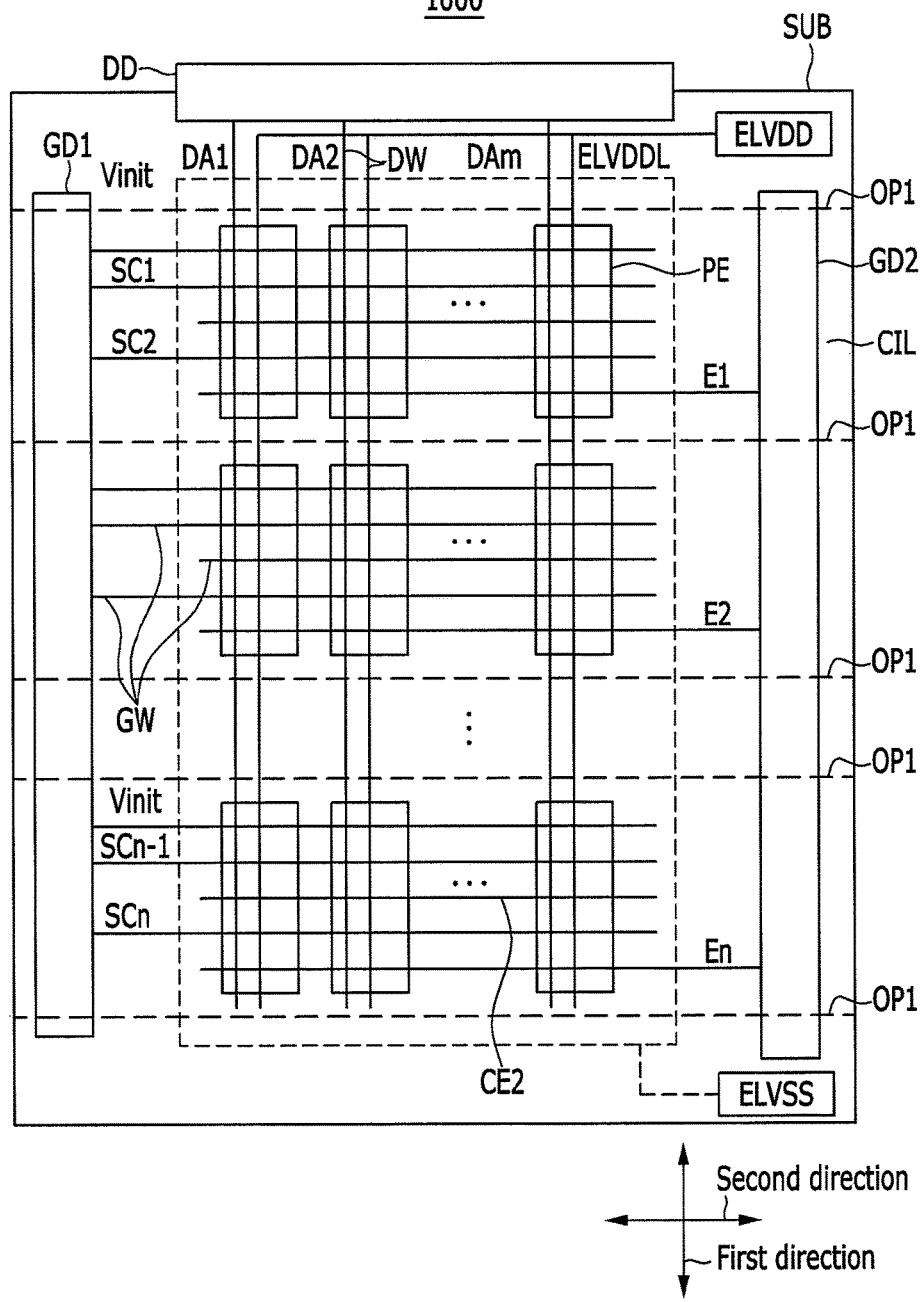
FIG. 1 is a diagram illustrating a display device according to a first exemplary embodiment.

Hereinafter, the described technology will be described more fully with reference to the accompanying drawings, in which exemplary embodiments of the described technology are shown. As those skilled in the art would realize, the described embodiments may be modified in various different ways, all without departing from the spirit or scope of the described technology.

Elements of the described technology which are irrelevant to the description will be omitted from the detailed description in order to clearly describe the described technology. The same elements will be designated by the same reference numerals throughout the specification.

Further, in the exemplary embodiments, since like reference numerals designate like elements having the same configuration, a first exemplary embodiment is representatively described, and in other exemplary embodiments, only the configurations different from the first exemplary embodiment will be described.

In addition, the size and thickness of the components of each configuration shown in the drawings may be exaggerated for understanding and ease of description, but the described technology is not limited thereto.

In the drawings, the thickness of layers, films, panels, regions, etc., may be exaggerated for clarity. Thus, for understanding and ease of description, the thickness of some layers and areas may be exaggerated. It will be understood that when an element such as a layer, film, region, or substrate is referred to as being "on" another element, it can be directly on the other element or intervening elements may also be present. The term "connected" as used herein also include the term "electrically connected."

In addition, unless explicitly described to the contrary, the word "comprise" and variations such as "comprises" or "comprising", will be understood to imply the inclusion of stated elements but not the exclusion of any other elements. Further, in the specification, the word "on" means positioning on or below an object, but does not necessarily mean positioning on the upper side of the object based on the orientation of the device with respect to gravity.

Hereinafter, a display device according to a first exemplary embodiment will be described with reference to FIGS. 1 to 3.

FIG. 1 is a diagram illustrating the display device according to the first exemplary embodiment.

As shown in FIG. 1, the display device 1000 includes a flexible substrate SUB, a gate driver GD1, gate wires GW, a light emission control driver GD2, a data driver DD, data wires DW, pixels PE, and an insulating layer CIL.

The flexible substrate SUB has a substantially planar rectangular shape and may be bent in a first direction parallel to the length (or a long side) of the flexible substrate SUB. The flexible substrate SUB may include at least one of a polymer material, such as polyimide, a metal material, or an inorganic material. However, the material of the flexible substrate is not limited thereto, and may include any material which is bendable. The flexible substrate SUB may have a substantially film form.

The flexible substrate SUB of the display device 1000 according to the first exemplary embodiment is described as having a substantially rectangular shape. However, according to some embodiments, the flexible substrate may have substantially any two dimensional shape, such as a circle, a triangle, an ellipse, a polygon, or a closed loop shape and the flexible substrate may bent in the first direction.

In the first exemplary embodiment, the flexible substrate SUB is bent in the first direction, however, according to some embodiments, the flexible substrate is bent in a second direction parallel to the width (or a short side) thereof. That is, the direction in which the rectangular flexible substrate SUB is bent may be a direction parallel to the length or the width of the flexible substrate SUB.

The gate driver GD1 sequentially applies a scan signal to each of first scan lines SC1 to SCn-1 and second scan lines SC2 to SCn included in the gate wires GW in response to a control signal received from an external control circuit (not illustrated), such as a timing controller. Then, the pixels PE are selected by the scan signals to sequentially receive data signals. Here, a pixel PE may be the smallest unit capable of displaying an image.

The gate wires GW are formed on the flexible substrate SUB and extend in the second direction which crosses the first direction. The gate wires GW include a first scan line SCn-1, light emission control lines E1 to En, a second scan line SCn, an initialization power line Vinit, and a second capacitor electrode CE2 to be described in detail below. The first scan line SCn-1 is connected to the gate driver GD1 and receives a scan signal from the gate driver GD1. The light emission control line En is connected to the light emission control driver GD2 and receives a light emission control signal from the light emission control driver GD2. The second scan line SCn is connected to the gate driver GD1 and receives a scan signal from the gate driver GD1. The initialization power line Vinit is connected to the gate driver GD1 and receives initialization power from the gate driver GD1. The second capacitor electrode CE2 is spaced apart from the first scan line SCn-1 and extends in the second direction.

As described above, the initialization power line Vinit, the first scan line SCn-1, the second capacitor electrode CE2, the second scan line SCn, and the light emission control line En are spaced apart from one another and extend in the second direction. Further, each of the initialization power line Vinit, the first scan line SCn-1, the second capacitor electrode CE2, the second scan line SCn, and the light emission control line En may be positioned on the same layer and formed of the same material, and may be formed through a single process, such as photolithography.

Alternatively, according to some embodiments, each of the initialization power line Vinit, the first scan line SCn-1, the second capacitor electrode CE2, the second scan line SCn, and the light emission control line En may be positioned on different layers and formed of different materials, and may be formed through a plurality of processes, such as repeated photolithography.

In the first exemplary embodiment, the initialization power line Vinit receives the initialization power from the gate driver GD1, however, according to some embodiments, the initialization power line Vinit may be connected to another additional element to receive the initialization power from the additional element.

The light emission control driver GD2 sequentially applies a light emission control signal to the light emission control line En in response to a control signal received from the external device, such as the timing controller. Then, light emission of the pixel PE is controlled by the light emission control signal.

That is, the light emission control signal controls the light emission timing of the pixels PE. However, the light emission control driver GD2 may be omitted based on the internal structure of the pixels PE.

The data driver DD applies a data signal to a data line DAm in response to a control signal received from the external device, such as the timing controller. The data signal applied to the data line DAm is applied to the pixel PE selected by the scan signal. Then, the pixel PE is charged to a voltage corresponding to the data signal and emits light with a luminance corresponding to the charged voltage.

The data wires DW are positioned over the gate wires GW and extend in the first direction. The data wires DW include data lines DA1 to DAm and a driving power line ELVDDL. The data line DAm is connected to the data driver DD and receives the data signal from the data driver DD. The driving power line ELVDDL is connected to an external first power supply ELVDD, to be described below, and receives driving power from the first power supply ELVDD.

The pixels PE are positioned on the flexible substrate SUB in regions where the gate wires GW and the data wires DW cross. The pixels PE include an OLED which emits light with a luminance corresponding to the driving current which corresponds to the data signal. The pixels PE also include a plurality of thin film transistors for controlling the driving current flowing in the OLED and one or more capacitors. The plurality of thin film transistors and one or more capacitors are connected to the gate wires GW and the data wires DW and the OLED is connected to the plurality of thin film transistors and one or more capacitors. The OLED is connected between the first power supply ELVDD and a second power supply ELVSS. A plurality of pixels PE are provided and are formed in a substantially matrix form in the first and second directions. The pixels PE display an image. Each pixel PE in the first exemplary embodiment has a substantially rectangular shape; however, the pixels PE according to some embodiments may have substantially any 2 dimensional shape, such as a circle, a triangle, a polygon, or a closed loop shape.

The insulating layer CIL is positioned on the flexible substrate SUB and is formed between constituent elements of the pixel PE to substantially prevent a short circuit between the constituent elements. The insulating layer CIL includes first opening patterns OP1 which extend in the second direction. A plurality of first opening patterns OP1 are provided and are spaced apart from one another in the first direction in which the flexible substrate SUB is bent. The first opening patterns OP1 are formed between the adjacent pixels PE and extend in the second direction.

Alternatively, according to some embodiments, the pixel is formed such that the long side of the pixel is substantially parallel to the second direction, and in this case, the first opening pattern may extend in the second direction which is substantially parallel to the long side of the pixel.

Hereinafter, the pixels PE and the insulating layer CIL will be described in detail with reference to FIGS. 2 and 3.

Figure 2:
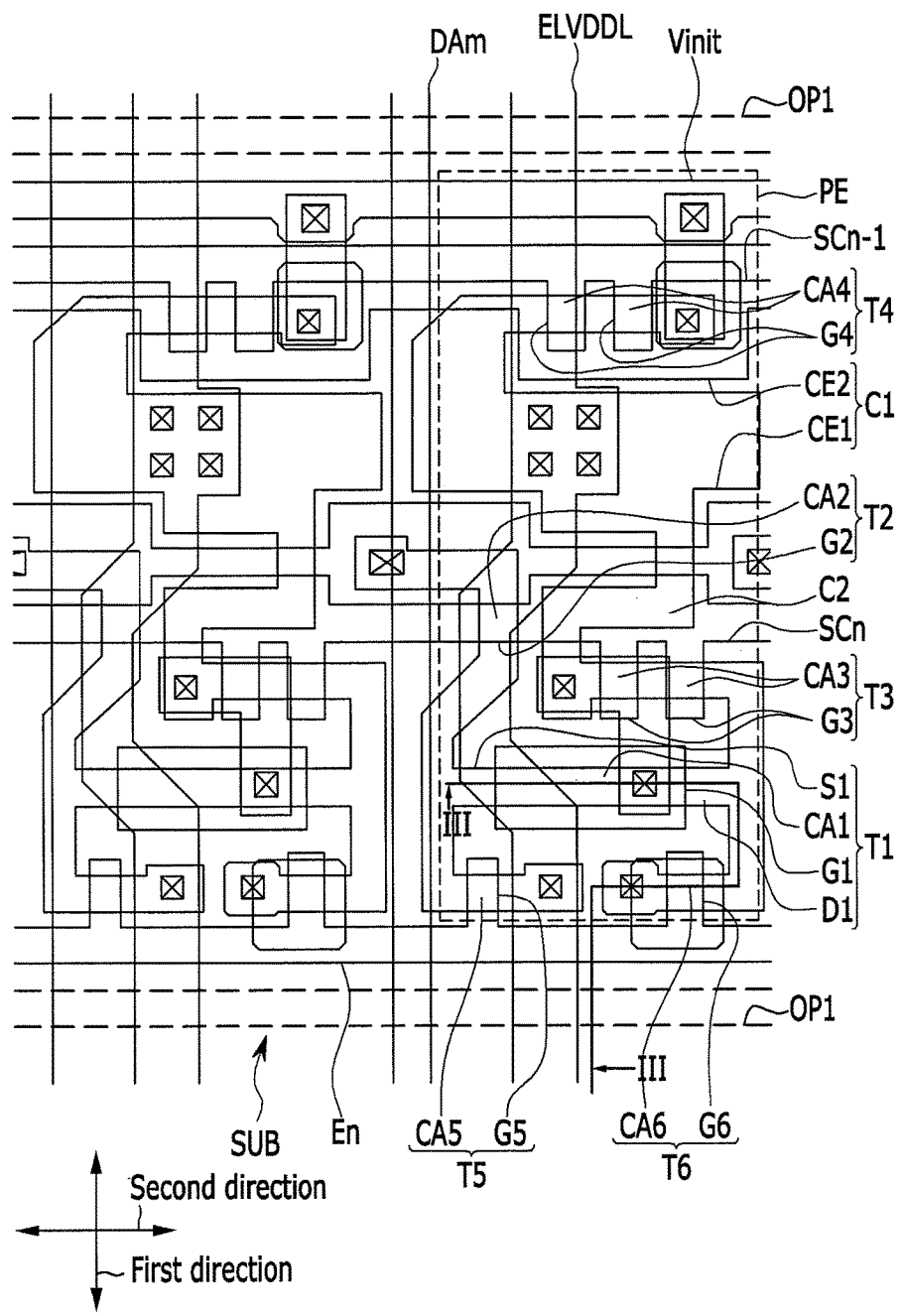
FIG. 2 is a layout view illustrating a pixel illustrated in FIG. 1.

FIG. 2 is a layout view illustrating a pixel illustrated in FIG. 1. FIG. 3 is a cross-sectional view taken along line III-III of FIG. 2.

Figure 3:
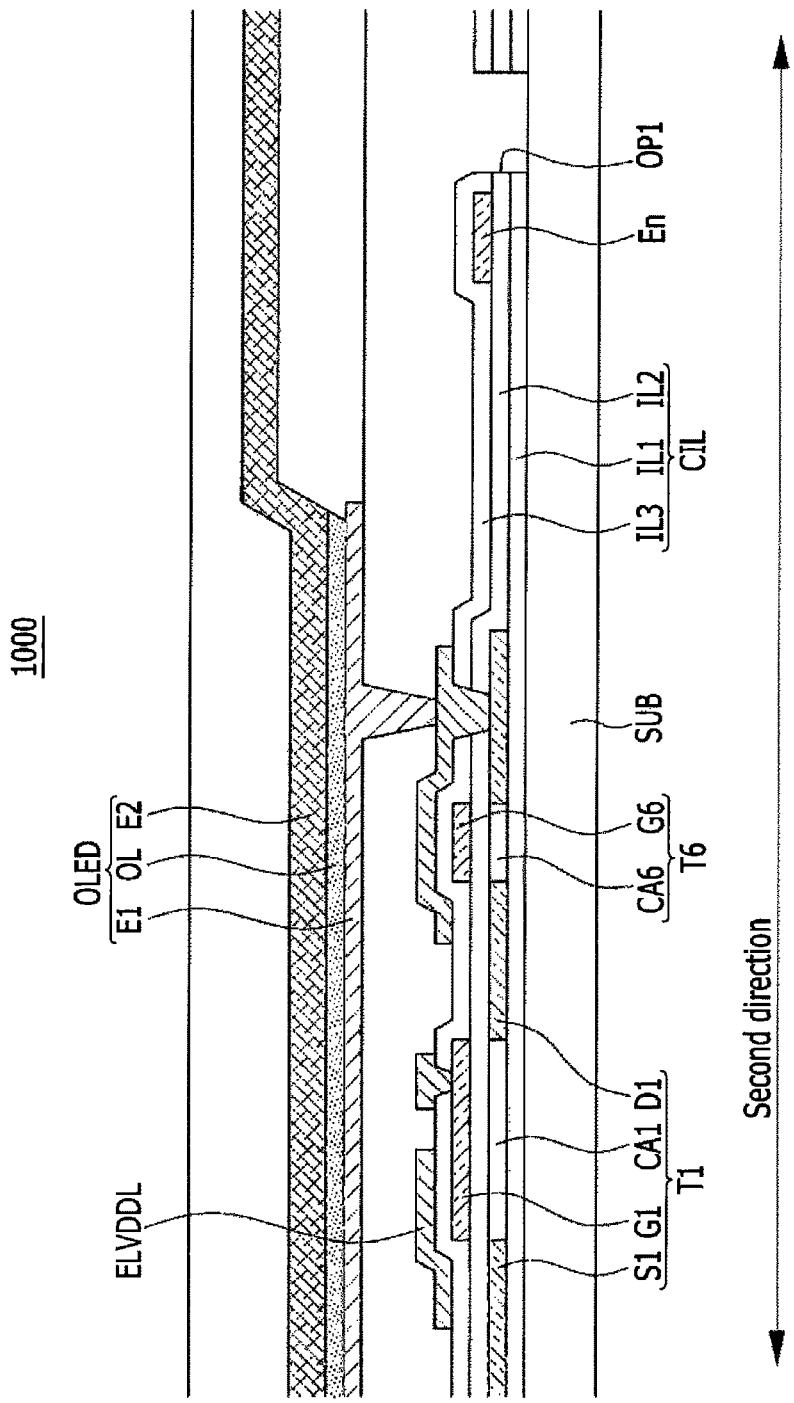
FIG. 3 is a cross-sectional view taken along line III-III of FIG. 2.

As illustrated in FIGS. 2 and 3, the pixel PE includes a pixel circuit including an organic light-emitting diode (OLED) connected between the first power supply ELVDD and the second power supply ELVSS, six thin film transistors connected between the OLED and the first power supply ELVDD to control the driving power supplied to the OLED, and two capacitors.

The OLED includes a first electrode E1, an organic light emission layer OL positioned on the first electrode E1, and a second electrode E2 positioned on the organic light emission layer OL. The first electrode E1, which is an anode of the OLED, is connected to the driving power line ELVDDL through the pixel circuit and the second electrode E2, which is a cathode of the OLED, is connected to the second power supply ELVSS. The organic light emitting layer OL emits light with a luminance corresponding to the driving current flowing through the OLED when the driving power is supplied thereto from the first power supply ELVDD through the pixel circuit and common power is supplied thereto from the second power supply ELVSS. The organic light emission layer OL may include a light emission material, such as a red, blue, green, or white emission material, or may be formed by stacking a plurality of light emission layers which can emit red, blue, green, or white light. The organic light emission layer OL may include red, green, and blue organic light emission layers which respectively emit red, green, and blue light. The red, green, and blue organic light emission layers are respectively formed in red, green, and blue pixels, to implement a color image. Further, the organic light emission layer OL in each of the red, green, and blue pixels may be formed by stacking all of the red, green, and blue organic light emission layers and forming red, green, and blue color filters over each pixel to implement a color image. As another example, a white organic light emission layer which can emit white light is formed in each of the red, green, and blue pixels, and red, green, and blue color filters are formed over the pixels to implement a color image. In the case where the color image is implemented using the white organic light emission layer and the color filters, it is not necessary to use a deposition mask for depositing the red, green, and blue organic light emission layers on the respective pixels. As another example, it is a matter of course that the white organic light emission layer may be formed of one organic light emission layer and includes a configuration in which white light is emitted by stacking a plurality of organic light emission layers. For example, the white organic light emission layer may also include a configuration in which at least one yellow organic light emission layer is combined with at least one blue organic light emission layer to emit white light, a configuration in which at least one cyan organic light emission layer is combined with at least one red organic light emission layer to emit white light, a configuration in which at least one magenta organic light emission layer is combined with at least one green organic light emission layer to emit white light, or the like.

The pixel circuit includes a first thin film transistor T1 and at least one second thin film transistor such as a second thin film transistor T2, a third thin film transistor T3, a fourth thin film transistor T4, a fifth thin film transistor T5, a sixth thin film transistor T6, and a first capacitor C1 and a second capacitor C2.

The first thin film transistor T1 is connected between the driving power line ELVDDL and the first electrode E1 of the OLED and supplies driving power corresponding to the data signal to the OLED from the first power supply ELVDD during a light emission period of the pixel PE. That is, the first thin film transistor T1 serves as a driving transistor of the pixel PE. The first thin film transistor T1 includes a first active layer CA1, a first gate electrode G1, a first source electrode S1, and a first drain electrode D1.

The first active layer CA1 is positioned on the flexible substrate SUB and is positioned between the first source electrode S1 and the first drain electrode D1 to connect the driving power line ELVDDL to the first electrode E1 of the OLED. The first active layer CA1 may be formed of amorphous silicon (a-Si), poly silicon, an oxide semiconductor, or the like. The oxide semiconductor forming the first active layer CA1 may include any one of oxides based on titanium (Ti), hafnium (Hf), zirconium (Zr), aluminum (Al), tantalum (Ta), germanium (Ge), zinc (Zn), gallium (Ga), tin (Sn) or indium (In), or a complex oxide thereof, such as zinc oxide (ZnO), indium-gallium-zinc oxide (In-GaZnO$_4$), indium-zinc oxide (Zn—In—O), indium-zinc oxide (Zn—Sn—O) indium-gallium oxide (In—Ga—O), indium-tin oxide (In—Sn—O), indium-zirconium oxide (In—Zr—O), indium-zirconium-zinc oxide (In—Zr—Zn—O), indium-zirconium-tin oxide (In—Zr—Sn—O), indium-zirconium-gallium oxide (In—Zr—Ga—O), indium-aluminum oxide (In—Al—O), indium-zinc-aluminum oxide (In—Zn—Al—O), indium-tin-aluminum oxide (In—Sn—Al—O), indium-aluminum-gallium oxide (In—Al—Ga—O), indium-tantalum oxide (In—Ta—O), indium-tantalum-zinc oxide (In—Ta—Zn—O), indium-tantalum-tin oxide (In—Ta—Sn—O), indium-tantalum-gallium oxide (In—Ta—Ga—O), indium-germanium oxide (In—Ge—O), indium-germanium-zinc oxide (In—Ge—Zn—O), indium-germanium-tin oxide (In—Ge—Sn—O), indium-germanium-gallium oxide (In—Ge—Ga—O), titanium-indium-zinc oxide (Ti—In—Zn—O), or hafnium-indium-zinc oxide (Hf—In—Zn—O).

The first active layer CA1 is positioned at the same layer as those of a second active layer CA2, a third active layer CA3, a fourth active layer CA4, a fifth active layer CA5, and a sixth active layer CA6. That is, the first to sixth active layers CA1 to CA6 may be formed by using a single process, such as a chemical vapor deposition process. The first active layer CA1 extends in the second direction, but is not limited thereto, and may extend in any direction crossing the first direction or the second direction.

The first gate electrode G1 is positioned on the first active layer CA1 and is connected to each of a first capacitor electrode CE1 of the first capacitor C1, the second capacitor C2, the third thin film transistor T3, and the fourth thin film transistor T4.

The first source electrode S1 is connected to one end of the first active layer CA1 and is connected to each of the second thin film transistor T2 and the fifth thin film transistor T5.

The first drain electrode D1 is connected to the other end of the first active layer CA1 and is connected to each of the third thin film transistor T3 and the sixth thin film transistor T6. The first electrode E1 of the OLED is connected to the first through sixth thin film transistors T1 to T6.

In the first exemplary embodiment, the first source electrode S1 and the first drain electrode D1 are positioned on the same layer as that of the first active layer CA1, however, according to some embodiments, the first source electrode S1 and the first drain electrode D1 are positioned on a different layer from that of a first active layer CA1 and are connected to the first active layer through a contact hole. In these cases, the first active layer may include a source region and a drain region in which impurities are doped and a channel region formed between the source and drain regions.

The insulating layer CIL substantially prevents a short circuit between the first active layer CA1 of the first thin film transistor T1 and the first gate electrode G1 and also substantially prevents a short circuit between the first gate electrode G1 and the first electrode E1 of the OLED. The insulating layer CIL includes a first sub-insulating layer IL1, a second sub-insulating layer IL2, a third sub-insulating layer IL3, and a first opening pattern OP1.

The first sub-insulating layer IL1 is positioned between the flexible substrate SUB and the first active layer CA1 and substantially prevents moisture from permeating to the first active layer CA1 through the flexible substrate SUB. One or more first sub-insulating layers IL1 may be formed. The first sub-insulating layer IL1 can include an inorganic material, such as a silicon nitride or a silicon oxide.

The second sub-insulating layer IL2 covers the first active layer CA1 and is positioned between the first active layer CA1 and the first gate electrode G1. The second sub-insulating layer IL2 substantially prevents a short circuit between the first active layer CA1 and the first gate electrode G1. One or more second sub-insulating layers IL2 may be formed. The second sub-insulating layer IL2 can include an inorganic material, such as a silicon nitride or a silicon oxide.

The third sub-insulating layer IL3 covers the first gate electrode G1 and substantially prevents a short circuit between the gate wire GW positioned on the same layer as that of the first gate electrode G1 and the data wire DW, such as the driving power line ELVDDL positioned on the gate wire GW. One or more third sub-insulating layers IL3 may be formed. The third sub-insulating layer IL3 can include an inorganic material, such as a silicon nitride or a silicon oxide.

That is, the, insulating layer CIL can include an inorganic material, such as a silicon nitride or a silicon oxide.

The first opening pattern OP1 is formed in the insulating layer CIL as described above, and more particularly, is formed in each of the first, second, and third sub-insulating layers IL1 to IL3.

As described above, in the display device 1000 according to the first exemplary embodiment, the insulating layer CIL includes the first opening pattern OP1 extending in the second direction between adjacent pixels PE, so that the pixels PE in each column are spaced apart from each other with the first opening pattern OP1 interposed therebetween and the pixels PE formed in the second direction have a substantially island shape on the flexible substrate SUB. The pixels PE in one column formed in the second direction have the substantially island shape on the flexible substrate SUB, so that when the flexible substrate SUB is bent in the first direction, the stress applied to the pixels PE in one column is minimized.

That is, even though the insulating layer CIL may be formed of a brittle inorganic material, since the insulating layer CIL includes the first opening pattern OP1 extending in the second direction damage to the insulating layer CIL due to the stress generated when the flexible substrate SUB is bent in the first direction or damage to the constituent elements of the pixel PE due to the stress generated in the insulating layer CIL can be minimized.

As described above, the display device includes the flexible substrate SUB and the insulating layer CIL includes the first opening pattern OP1 to minimize the stress applied to the insulating layer CIL. Accordingly, damage to the gate wire GW, the data wire DW, and the pixels PE due to the stress applied to the insulating layer CIL is minimized.

The insulating layer CIL substantially prevents a short circuit between the constituent elements of each of the second thin film transistor T2 to the sixth thin film transistor T6 to be described in detail below.

The second thin film transistor T2 connects the data line DAm to the first thin film transistor T1 and includes a second gate electrode G2 connected to the second scan line SCn. When a scan signal is received from the second scan line SCn, the second thin film transistor T2 transfers the data signal received from the data line DAm to the pixel PE. That is, the second thin film transistor T2 serves as a switching transistor of the pixel PE. The second thin film transistor T2 connects the data line DAm to the first thin film transistor T1. The second thin film transistor T2 also includes the second active layer CA2 positioned so as to correspond to the second gate electrode G2.

The third thin film transistor T3 connects the first drain electrode D1 of the first thin film transistor T1 to the first gate electrode G1 and includes a third gate electrode G3 connected to the second scan line SCn. The third thin film transistor T3 diode connects the first thin film transistor T1 when the data signal is applied to the pixel PE to compensate for the threshold voltage of the first thin film transistor T1. That is, the third thin film transistor T3 serves as a compensation transistor of the pixel PE. The third thin film transistor T3 connects the first drain electrode D1 to the first gate electrode G1 and includes the third active layer CA3 positioned so as to correspond to the third gate electrode G3.

The fourth thin film transistor T4 connects the initialization power line Vinit to the first gate electrode G1 of the first thin film transistor T1 and includes a fourth gate electrode G4 connected to the first scan line SCn-1. The fourth thin film transistor T4 initializes the first thin film transistor T1 by transferring the initialization power received from the initialization power line Vinit to the pixel PE when the scan signal is received from the first scan line SCn-1. The scan signal is applied to the first scan line during the initialization period prior to the data programming period so that the data signal is smoothly applied to the pixel PE during a data programming period during which the data signal is input to the pixel PE. That is, the fourth thin film transistor T4 serves as a switching transistor of the pixel PE. The fourth thin film transistor T4 is connects the initialization power line Vinit to the first gate electrode G1 of the first thin film transistor T1 and includes a fourth active layer CA4 positioned so as to correspond to a fourth gate electrode G4.

The fifth thin film transistor T5 connects the driving power line ELVDDL to the first thin film transistor T1 and includes a fifth gate electrode G5 connected to the light emission control line En. The fifth thin film transistor T5 substantially prevents a connection between the driving power line ELVDDL and the first thin film transistor T1 during a non-emission period of the pixel PE and electrically connects the driving power line ELVDDL to the first thin film transistor T1 during the light emission period of the pixel PE. That is, the fifth thin film transistor T5 serves as a switching transistor of the pixel PE. The fifth thin film transistor T5 connects the driving power line ELVDDL to the first thin film transistor T1 and includes a fifth active layer CA5 positioned so as to correspond to the fifth gate electrode G5.

The sixth thin film transistor T6 connects the first thin film transistor T1 to the first electrode E1 of the OLED, and includes a sixth gate electrode G6 connected to the light emission control line En. The sixth thin film transistor T6 substantially prevents a connection between the first thin film transistor T1 and the OLED during the non-emission period of the pixel PE and connects the first thin film transistor T1 to the OLED during the light emission period of the pixel PE. That is, the sixth thin film transistor T6 serves as a switching transistor of the pixel PE. The sixth thin film transistor T6 connects the first thin film transistor T1 to the first electrode E1 of the OLED and includes a sixth active layer CA6 positioned so as to correspond to the sixth gate electrode G6.

The first electrode E1 is connected to the drain electrode of the sixth thin film transistor T6 through the insulating layer CIL.

Further, the first to sixth gate electrodes G1 to G6 may be positioned on the same layer or in different layers and may be substantially simultaneously formed with the gate wires GW by using a single process, such as photolithography.

The first capacitor C1 stores the data signal applied to the pixel PE during the data programming period and stores the data signal for one frame. The first capacitor is formed between the driving power line ELVDDL and the first gate electrode G1 of the first thin film transistor T1. That is, the first capacitor C1 serves as a storage capacitor.

The first capacitor C1 is positioned on the flexible substrate SUB and includes the first capacitor electrode CE1 and the second capacitor electrode CE2 facing each other with the first sub-insulating layer CIL1 interposed therebetween.

The first capacitor electrode CE1 is connected to the initialization power line Vinit through the fourth thin film transistor T4 and is positioned on the same layer as the first to sixth active layers CA1 to CA6.

According to some embodiments, the first capacitor electrode may be positioned in a different layer from the first to sixth active layers CA1 to CA6.

The second capacitor electrode CE2 is connected to the driving power line ELVDDL and is positioned on the same layer as the gate wires GW. The second capacitor electrode CE2 crosses the adjacent pixel PE and extends in the second direction as illustrated in FIG. 1.

The purpose of the second capacitor C2 is to compensate for a drop in the voltage due to a load in the display device 1000 and the second capacitor C2 is formed between the first capacitor electrode CE1 of the first capacitor C1 and the second scan line SCn. That is, the second capacitor C2 compensates for a change in the voltage level of the current scan signal, which can typically occur when the application of the current scan signal is stopped.

The second capacitor C2 increases the voltage of the first gate electrode G1 of the first thin film transistor T1 by a coupling action to serve as a boosting capacitor compensating for a voltage drop due to a load within the display device 1000.

Hereinafter, the operation of the aforementioned pixel PE will be described.

First, a previous scan signal having a low level is applied to the first scan line SCn-1 for a first period set as an initialization period. Then, the fourth thin film transistor T4 is turned on in response to the previous scan signal and the initialization power is applied to the first thin film transistor T1 through the fourth thin film transistor T4 from the initialization power line Vinit so that the first thin film transistor T1 is initialized.

Next, the current scan signal having a low level is applied to the second scan line SCn for a second period set as the data programming period. Then, the second thin film transistor T2 and the third thin film transistor T3 are turned on in response to the current scan signal.

Then, the first thin film transistor T1 is turned on and is diode connected by the third thin film transistor T3. Thus, the first thin film transistor T1 is initialized during the previous first period so that the first thin film transistor T1 is diode connected.

Accordingly, the data signal received from the data line DAm passes through the second thin film transistor T2, the first thin film transistor T1, and the third thin film transistor T3 so that the a voltage corresponding to a difference between the data signal and the threshold voltage of the first thin film transistor T1 is stored in the first capacitor C1.

Then, when the application of the current scan signal is stopped and the voltage level of the scan signal is changed to a high level, the voltage applied to the first gate electrode G1 of the first thin film transistor T1 is changed by a coupling action of the second capacitor C2 in response to the voltage variation range of the current scan signal. In this case, the voltage applied to the first gate electrode G1 of the first thin film transistor T1 is changed by charge sharing between the first capacitor C1 and the second capacitor C2, so that the variation of the voltage applied to the first gate electrode G1 is changed in proportion to the charge sharing between the first capacitor C1 and the second capacitor C2 together with the voltage variation of the current scan signal.

Then, the light emission control signal is applied to the light emission control line En for a third period set as the light emission period. Then, the fifth and sixth thin film transistors T5 and T6 are turned on by the light emission control signal having a low level for the third period. Accordingly, a driving current is applied to the second power supply ELVSS via the fifth thin film transistor T5, the first thin film transistor T1, the sixth thin film transistor T6, and the OLED through the driving power line ELVDDL from the first power supply ELVDD.

The driving current is controlled by the first thin film transistor T1 and the first thin film transistor T1 generates a driving current having a level corresponding to the voltage supplied to the first gate electrode G1 thereof. In this case, for the aforementioned second period, the voltage corresponding to a difference between the data signal and the threshold voltage of the first thin film transistor T1 is stored in the first capacitor C1, so that the threshold voltage of the first thin film transistor T1 is compensated for in the third period.

As described above, in the display device 1000 according to the first exemplary embodiment, the insulating layer CIL includes the first opening pattern OP1 extending in the second direction so that the pixels PE in each column are spaced apart from each other with the first opening pattern OP1 interposed therebetween. Also, the pixels PE in each column are formed in the second direction and have a substantially island form on the flexible substrate SUB so that when the flexible substrate SUB is bent in the first direction, the stress applied to the pixels PE in one column is minimized. That is, even when the insulating layer CIL is formed of a brittle inorganic material, the insulating layer CIL includes the first opening pattern OP1 extending in the second direction, so that damage to the insulating layer CIL due to the stress generated when the flexible substrate SUB is bent in the first direction or damage to the constituent elements of the pixel PE due to the stress generated in the insulating layer CIL is minimized.

As described above, the display device includes the flexible substrate SUB and the insulating layer CIL includes the first opening pattern OP1 to minimize the stress applied to the insulating layer CIL. Accordingly, the described technology provides the display device 1000 in which the damage to the gate wire GW, the data wire DW, and the pixels PE due to the stress applied to the insulating layer CIL is minimized when the flexible substrate SUB is bent.

Hereinafter, a display device according to a second exemplary embodiment will be described with reference to FIG. 4.

Hereinafter, only the configurations of the present embodiment which differ from the first embodiment will be described. Further, in the second exemplary embodiment, the same constituent elements will be denoted with the same reference numerals as in the first exemplary embodiment for convenience of the description.

Figure 4:
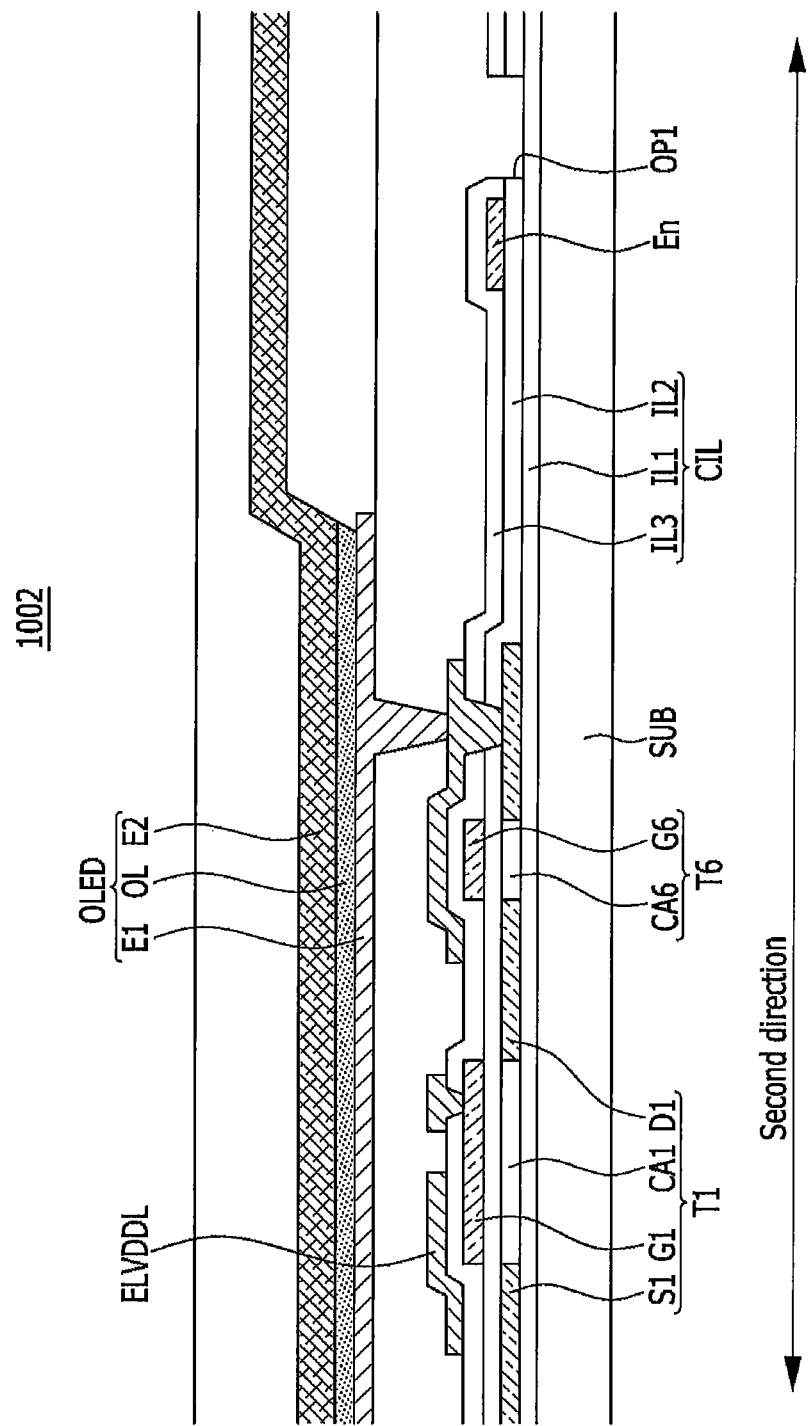
FIG. 4 is a cross-sectional view illustrating a portion of a pixel of a display device according to a second exemplary embodiment.

FIG. 4 is a cross-sectional view illustrating a portion of a pixel according to the second exemplary embodiment.

As illustrated in FIG. 4, a first opening pattern OP1 is formed in the insulating layer CIL, and more particularly, the first opening pattern OP1 is formed in the second sub-insulating layer IL2 and third sub-insulating layer IL3.

As described above, in the display device 1002 according to the second exemplary embodiment, the first opening pattern OP1 formed in the insulating layer CIL is formed only in the second and third sub-insulating layers IL2 and IL3, so that stress generated in the insulating layer CIL is minimized when the flexible substrate SUB is bent in the first direction, thereby minimizing damage to the insulating layer CIL or damage to the constituent elements of pixels PE due to the stress generated in the insulating layer CIL.

Further, in the display device 1002 according to the second exemplary embodiment, the first opening pattern OP1 formed in the insulating layer CIL is formed only in the second and third sub-insulating layers IL2 and IL3 so that moisture can be substantially prevented from permeating to the OLED from the environment through the flexible substrate SUB due to the first sub-insulating layer IL1.

Hereinafter, a display device according to the third exemplary embodiment will be described with reference to FIG. 5.

Hereinafter, only the configurations of the present embodiment which differ from the first embodiment will be described. Further, in the third exemplary embodiment, the same constituent elements will be denoted with the same reference numerals as in the first exemplary embodiment for convenience of the description.

Figure 5:
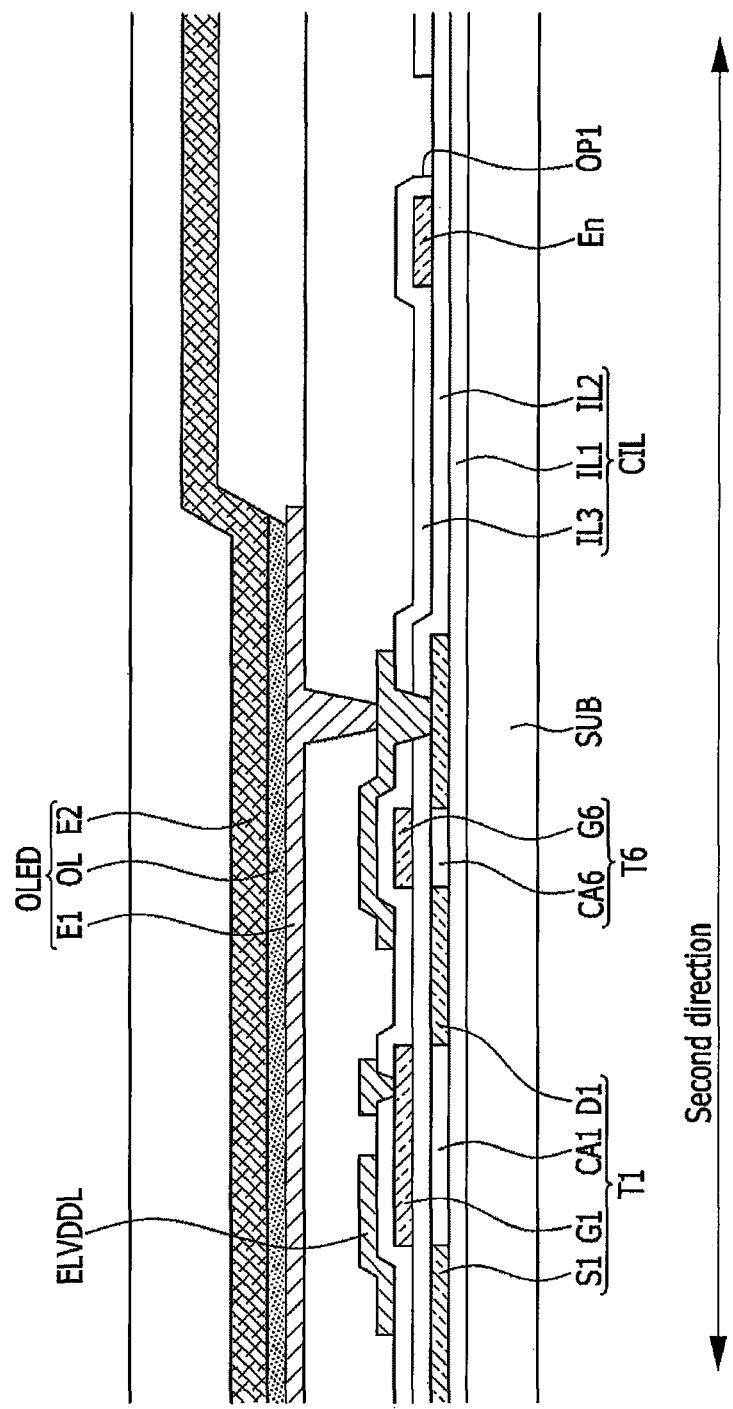
FIG. 5 is a cross-sectional view illustrating a portion of a pixel of a display device according to a third exemplary embodiment.

FIG. 5 is a cross-sectional view illustrating a portion of a pixel according to the third exemplary embodiment.

As illustrated in FIG. 5, a first opening pattern OP1 is formed in the insulating layer CIL, and more particularly, is formed only in the third sub-insulating layer IL3.

As described above, in the display device 1003 according to the third exemplary embodiment, the first opening pattern OP1 formed in the insulating layer CIL is formed only in the third sub-insulating layer IL3 so that stress generated in the insulating layer CIL is minimized when the flexible substrate SUB is bent in the first direction, thereby minimizing damage to the insulating layer CIL or damage to the constituent elements of pixels PE due to the stress generated in the insulating layer CIL.

Further, in the display device 1003 according to the third exemplary embodiment, the first opening pattern OP1 formed in the insulating layer CIL is formed only in the third sub-insulating layer IL3 so that moisture can be substantially prevented from permeating to the OLED from the environment through the flexible substrate SUB due to the first and second sub-insulating layers IL1 and IL2.

Hereinafter, a display device according to a fourth exemplary embodiment will be described with reference to FIG. 6.

Hereinafter, only the configurations of the present embodiment which differ from the first embodiment will be described. Further, in the fourth exemplary embodiment, the same constituent elements will be denoted by the same reference numerals as in the first exemplary embodiment for convenience of the description.

Figure 6:
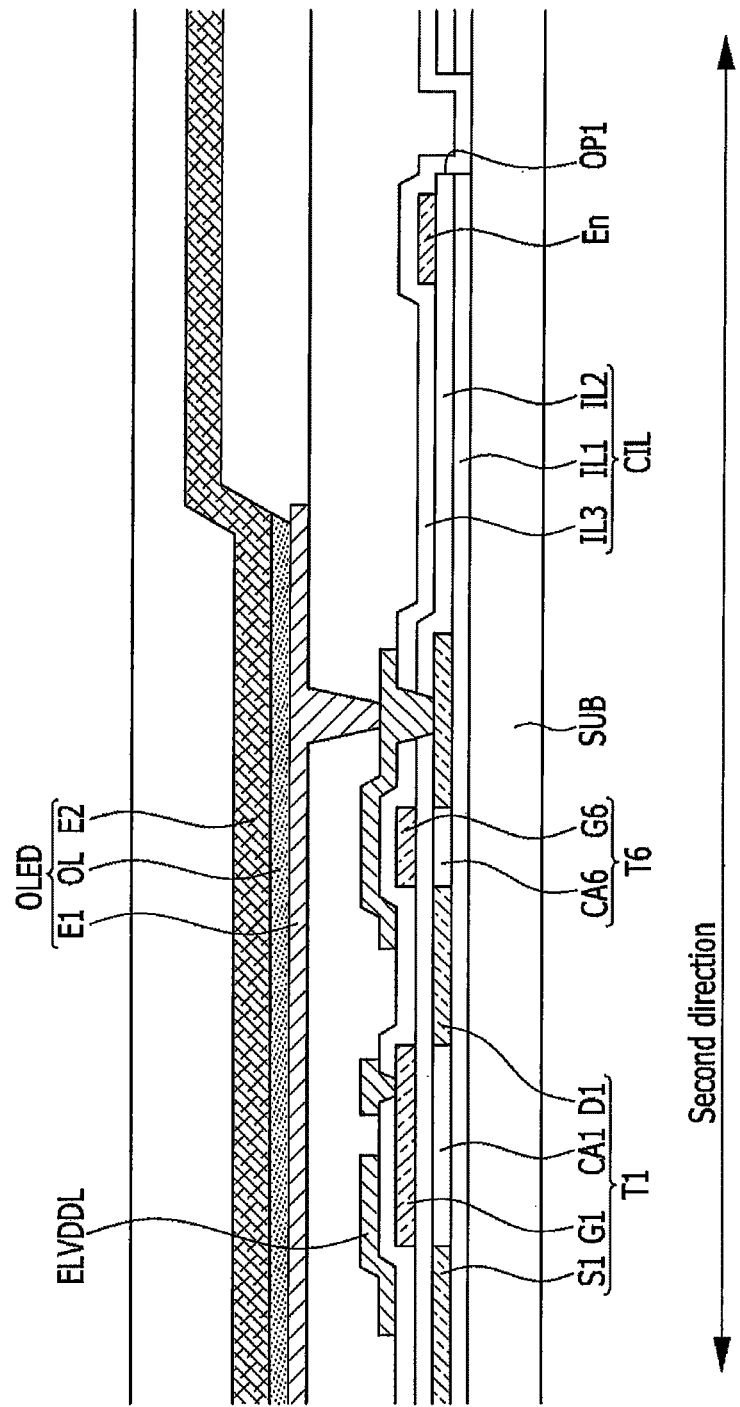
FIG. 6 is a cross-sectional view illustrating a portion of a pixel of a display device according to a fourth exemplary embodiment.

FIG. 6 is a cross-sectional view illustrating a portion of a pixel according to the fourth exemplary embodiment.

As illustrated in FIG. 6, a first opening pattern OP1 is formed in the insulating layer CIL, and more particularly, is formed in the first sub-insulating layer IL1 and the second sub-insulating layer IL2.

As described above, in the display device 1004 according to the fourth exemplary embodiment, the first opening pattern OP1 formed in the insulating layer CIL is formed only in the first and second sub-insulating layers IL1 and IL2 so that stress generated in the insulating layer CIL is minimized when the flexible substrate SUB is bent in the first direction, thereby minimizing damage to the insulating layer CIL or damage to constituent elements of pixels PE due to the stress generated in the insulating layer CIL.

Further, in the display device 1004 according to the fourth exemplary embodiment, the first opening pattern OP1 formed in the insulating layer CIL is formed only in the first and second sub-insulating layers IL1 and IL2 so that moisture can be substantially prevented from permeating to the OLED from the environment through the flexible substrate SUB due to the third sub-insulating layer IL3.

Hereinafter, a display device according to a fifth exemplary embodiment will be described with reference to FIG. 7.

Hereinafter, only the configurations of the present embodiment which differ from the first embodiment will be described. Further, in the fifth exemplary embodiment, the same constituent elements will be denoted with the same reference numerals as in the first exemplary embodiment for convenience of the description.

Figure 7:
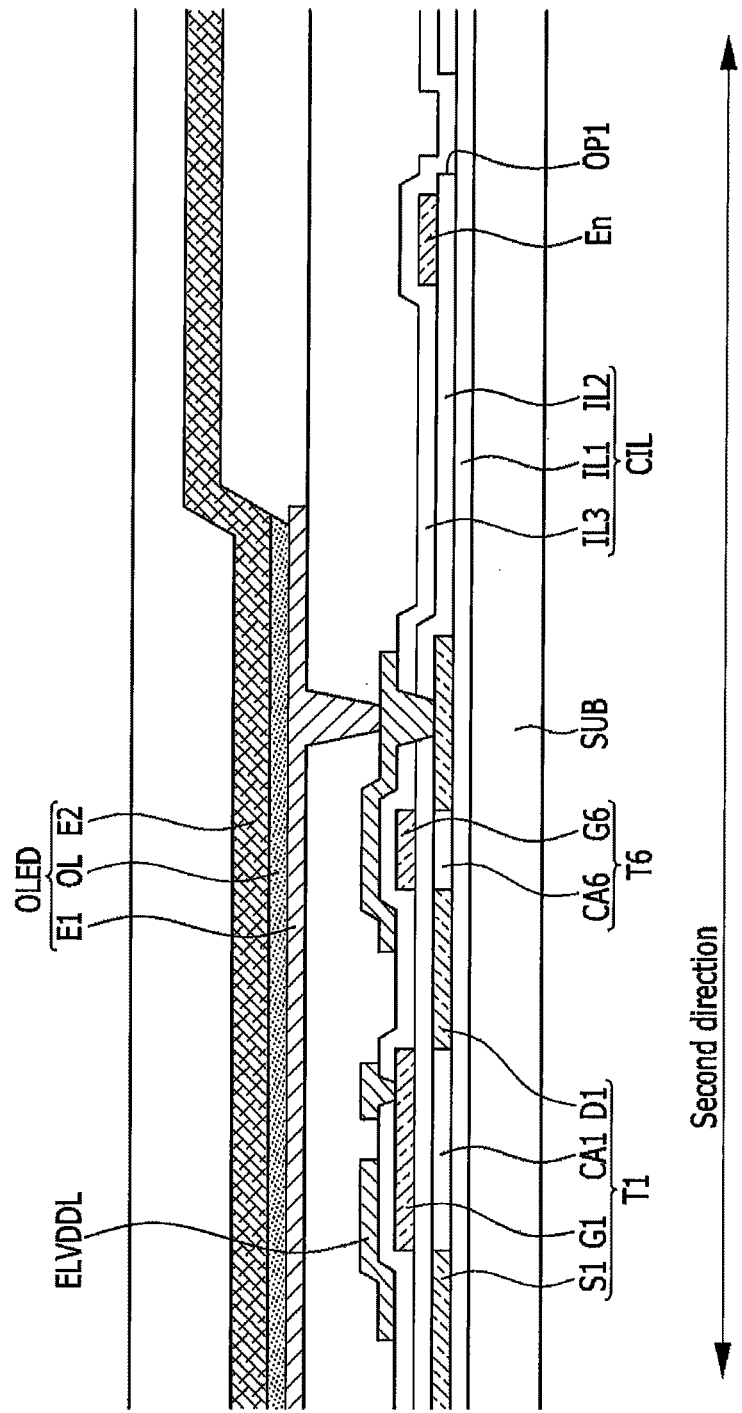
FIG. 7 is a cross-sectional view illustrating a portion of a pixel of a display device according to a fifth exemplary embodiment.

FIG. 7 is a cross-sectional view illustrating a portion of a pixel according to the fifth exemplary embodiment.

As illustrated in FIG. 7, a first opening pattern OP1 is formed in the insulating layer CIL, and more particularly, is formed only in the second sub-insulating layer IL2.

As described above, in the display device 1005 according to the fifth exemplary embodiment, the first opening pattern OP1 formed in the insulating layer CIL is formed only in the second sub-insulating layer IL2 so that stress generated in the insulating layer CIL is minimized when the flexible substrate SUB is bent in the first direction, thereby minimizing damage to the insulating layer CIL or damage to constituent elements of pixels PE due to the stress generated in the insulating layer CIL.

Further, in the display device 1005 according to the fifth exemplary embodiment, the first opening pattern OP1 formed in the insulating layer CIL is formed only in the second sub-insulating layer IL2 so that moisture can be substantially prevented from permeating to the OLED from the environment through the flexible substrate SUB due to the first and third sub-insulating layers IL1 and IL3.

Hereinafter, a display device according to a sixth exemplary embodiment will be described with reference to FIG. 8.

Hereinafter, only the configurations of the present embodiment which differ from the first embodiment will be described. Further, in the sixth exemplary embodiment, the same constituent elements will be denoted with the same reference numerals as in the first exemplary embodiment for convenience of the description.

Figure 8:
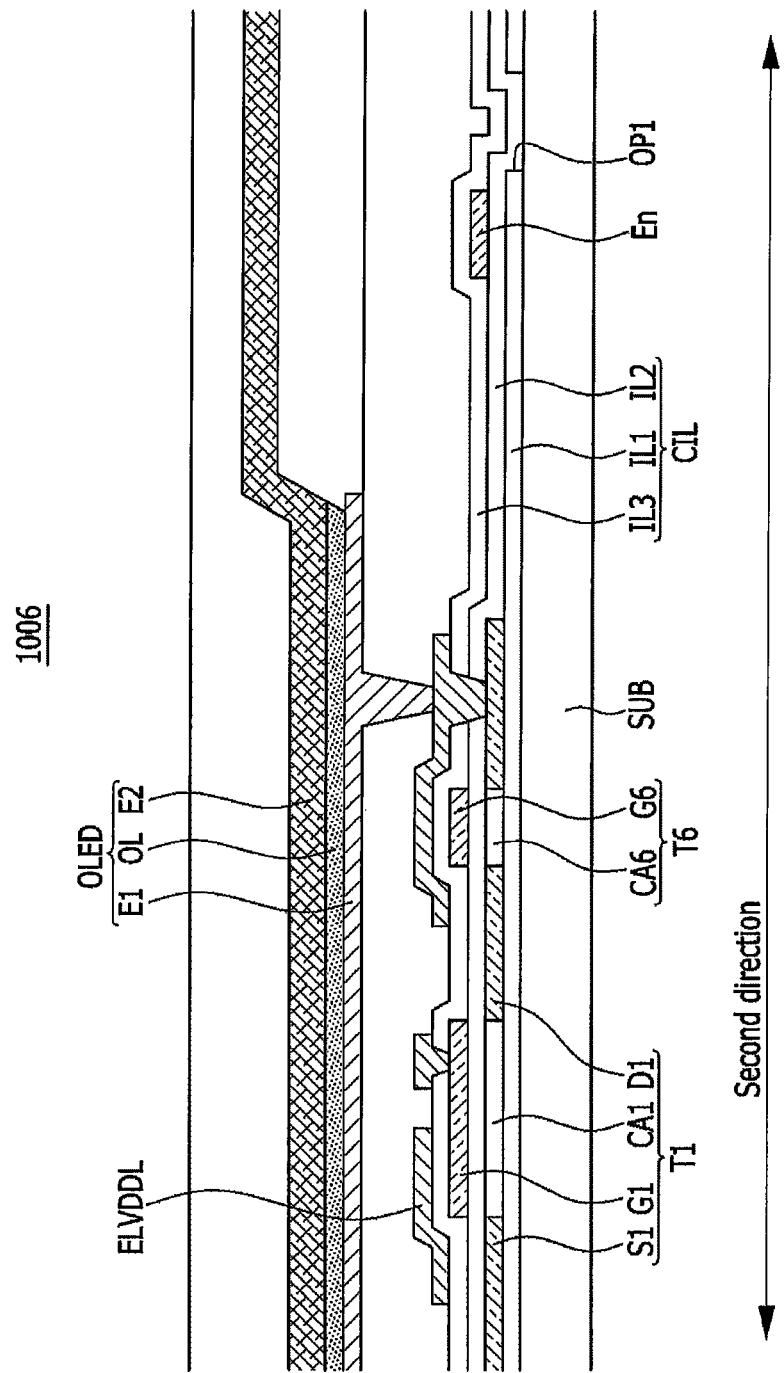
FIG. 8 is a cross-sectional view illustrating a portion of a pixel of a display device according to a sixth exemplary embodiment.

FIG. 8 is a cross-sectional view illustrating a portion of a pixel according to the sixth exemplary embodiment.

As illustrated in FIG. 8, a first opening pattern OP1 is formed in the insulating layer CIL, and more particularly, is formed in a first sub-insulating layer IL1.

As described above, in the display device 1006 according to the sixth exemplary embodiment, the first opening pattern OP1 formed in the insulating layer CIL is formed only in the first sub-insulating layer IL1 so that stress generated in the insulating layer CIL is minimized when the flexible substrate SUB is bent in the first direction, thereby minimizing damage to the insulating layer CIL or damage to constituent elements of pixels PE due to the stress generated in the insulating layer CIL.

Further, in the display device 1006 according to the sixth exemplary embodiment, the first opening pattern OP1 formed in the insulating layer CIL is formed only in the first sub-insulating layer IL1 so that moisture can be substantially prevented from permeating to the OLED from the environment through the flexible substrate SUB due to the second and third sub-insulating layers IL2 and IL3.

Hereinafter, a display device according to a seventh exemplary embodiment will be described with reference to FIG. 9.

Hereinafter, only the configurations of the present embodiment which differ from the first embodiment will be described. Further, in the seventh exemplary embodiment, the same constituent elements will be denoted with the same reference numerals as in the first exemplary embodiment for convenience of the description.

Figure 9:
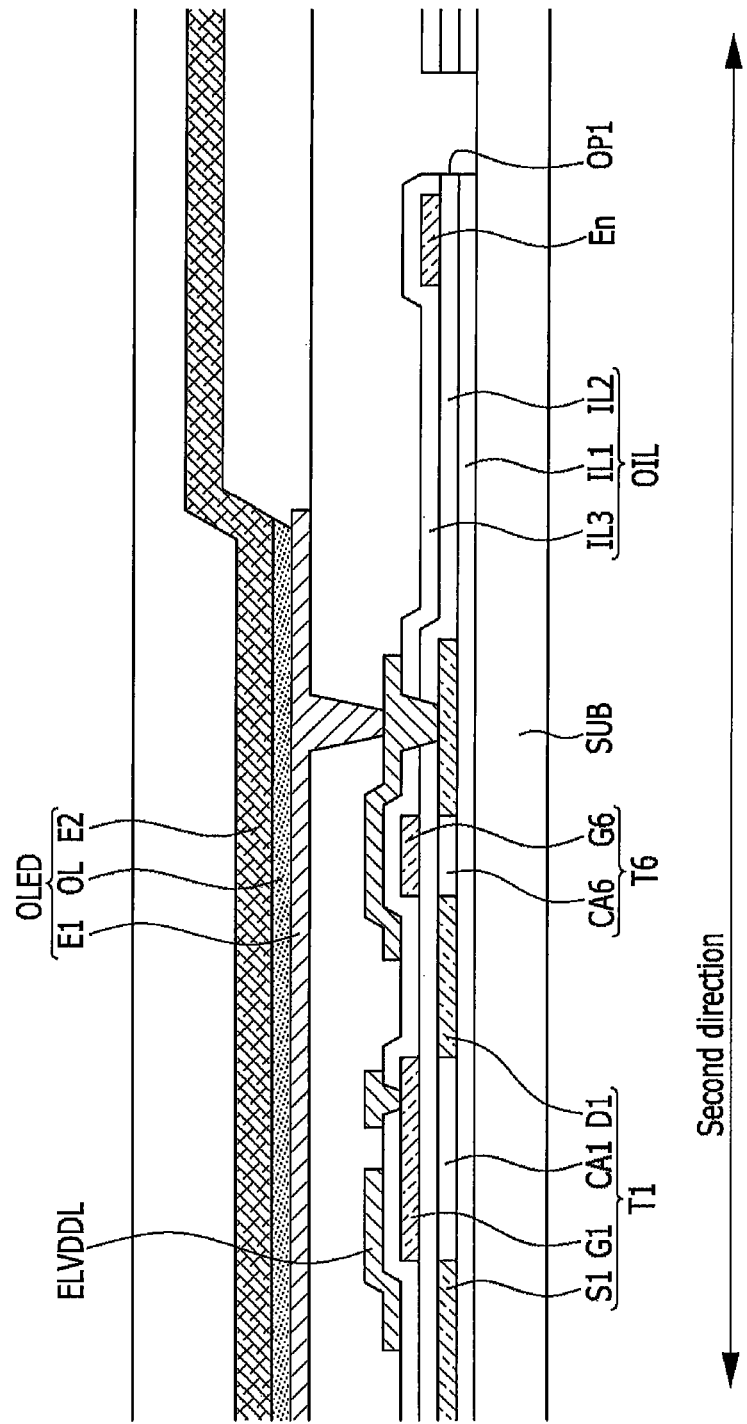
FIG. 9 is a cross-sectional view illustrating a portion of a pixel of a display device according to a seventh exemplary embodiment.

FIG. 9 is a cross-sectional view illustrating a portion of a pixel according to a seventh exemplary embodiment.

As illustrated in FIG. 9, at least one layer among the first, second, and third sub-insulating layers IL1 to IL3 of an insulating layer OIL includes an organic material, including polyimide, phenylene, or siloxane. That is, the insulating layer OIL includes an organic material including polyimide, phenylene, or siloxane.

As described above, in the display device 1007 according to the seventh exemplary embodiment, the insulating layer OIL includes an organic material, which produces less stress when bent compared to an inorganic material, so that stress generated in the insulating layer OIL is minimized when the flexible substrate SUB is bent in the first direction, thereby minimizing damage to the insulating layer OIL or damage to constituent elements of pixels PE due to the stress generated in the insulating layer OIL.

That is, the insulating layer OIL includes both the first opening pattern OP1 and the organic material, so that the defects formed due to stress generated when the flexible substrate SUB is bent are minimized.

Hereinafter, a display device according to an eighth exemplary embodiment will be described with reference to FIG. 10.

Hereinafter, only the configurations of the present embodiment which differ from the first embodiment will be described. Further, in the eighth exemplary embodiment, the same constituent elements will be denoted with the same reference numerals as in the first exemplary embodiment for convenience of the description.

Figure 10:
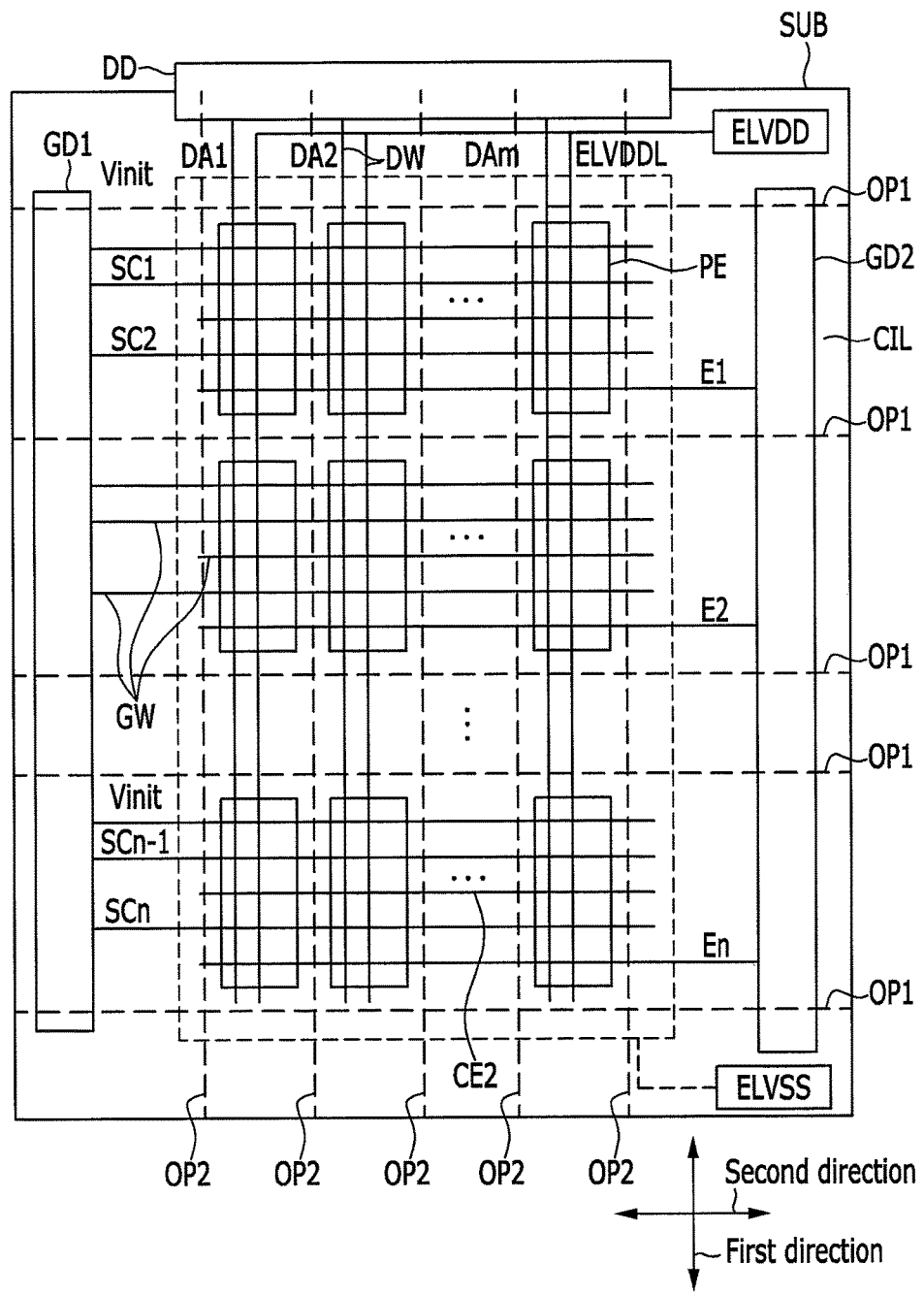
FIG. 10 is a diagram illustrating a display device according to an eighth exemplary embodiment.

FIG. 10 is a diagram illustrating a display device according to an eighth exemplary embodiment.

As illustrated in FIG. 10, the insulating layer CIL of the display device 1008 is positioned on a flexible substrate SUB and includes a first opening pattern OP1 extending in the second direction crossing the first direction. The insulating layer CIL also includes a second opening pattern OP2 crossing the first opening pattern OP1 and extending in the first direction. The flexible substrate SUB can be bent in the first direction or the second direction.

A plurality of first opening patterns OP1 are formed and are spaced apart from one another in the first direction, in which the flexible substrate SUB can be bent. The first opening patterns OP1 are formed between adjacent pixels PE and extend in the second direction parallel to a short side of the pixel PE.

A plurality of second opening patterns OP2 are formed and are spaced apart from one another in the second direction, in which the flexible substrate SUB can be bent. The second opening patterns OP2 are formed between adjacent pixels PE and extend in the first direction parallel to a long side of the pixel PE.

The first and second opening patterns OP1 and OP2 are formed in a substantially mesh shape and each of the pixels PE is surrounded by the intersection between the first and second opening patterns OP1 and OP2.

As described above, in the display device 1008 according to the eighth exemplary embodiment, the insulating layer CIL includes the first and second opening patterns OP1 and OP2 surrounding each of the pixels PE, so that each of the pixels PE has a substantially island shape on the flexible substrate SUB. Each of the pixels PE has the substantially island shape so that when the flexible substrate SUB is bent in the first or second direction, stress applied to each of the plurality of pixels PE by the insulating layer CIL is minimized.

That is, even though the insulating layer CIL can be formed of a brittle inorganic material, the insulating layer CIL includes the first and second opening patterns OP1 and OP2, so that damage to the insulating layer CIL due to the stress generated when the flexible substrate SUB is bent in either the first or second direction or damage to the constituent elements of the pixels PE due to the stress generated in the insulating layer CIL is minimized.

As described above, the insulating layer CIL includes the first and second opening patterns OP1 and OP2 to minimize the stress applied to the insulating layer CIL when the flexible substrate SUB is bent. Accordingly, damage to the gate wires GW, the data wires DW, and the pixels PE due to the stress applied to the insulating layer CIL is minimized.

While this described technology has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A display device, comprising:
a flexible substrate configured to be bent in a first direction;
at least one first insulating layer disposed over the flexible substrate and including a first opening pattern that extends in a second direction crossing the first direction, wherein the at least one first insulating layer includes a first portion and a second portion that are spaced apart from each other, and wherein the first opening pattern is interposed between the first portion and the second portion; and
at least one second insulating layer disposed over the flexible substrate,
wherein the first opening pattern comprises a plurality of second sub-opening patterns overlapping in a depth direction of the flexible substrate.

2. The display device of claim 1, wherein the at least one second insulating layer includes a portion disposed in the first opening pattern.

3. The display device of claim 1, wherein the at least one second insulating layer includes a portion between the first portion and the second portion.

4. The display device of claim 1, wherein a bottom surface of the at least one second insulating layer contacts the flexible substrate through the first opening pattern.

5. The display device of claim 1, wherein the at least one second insulating layer includes an organic material.

6. The display device of claim 1, wherein the at least one first insulating layer includes an inorganic material.

7. The display device of claim 1, wherein the at least one second insulating layers includes a groove or an opening corresponding to the first opening pattern.

8. The display device of claim 7, wherein the groove or the opening extends in the second direction.

9. The display device of claim 7, wherein the groove or the opening extends in the first direction.

10. The display device of claim 1, wherein the first opening pattern comprises a plurality of first sub-opening patterns spaced apart from each other in the first direction.

11. The display device of claim 1, wherein the at least one first insulating layer includes an organic material.

12. The display device of claim 1, wherein the first opening pattern is defined by side surfaces of the first portion and the second portion.

13. A display device, comprising
a flexible substrate configured to be bent in a first direction;
at least one first insulating layer disposed over the flexible substrate and including a first opening pattern that extends in a second direction crossing the first direction, wherein the at least one first insulating layer includes a first portion and a second portion that are spaced apart from each other, and wherein the first opening pattern is interposed between the first portion and the second portion; and
at least one second insulating layer disposed over the flexible substrate,
wherein the at least one second insulating m includes a groove or an opening corresponding to the first opening pattern, and
wherein the groove or the opening is adjacent to an edge of the flexible substrate.

14. A display device, comprising:
a flexible substrate configured to be bent in a first direction;
at least one first insulating layer disposed over the flexible substrate and including a first opening pattern that extends in a second direction crossing the first direction, wherein the at least one first insulating layer includes a first portion and a second portion that are spaced apart from each other, and wherein the first opening pattern is interposed between the first portion and the second portion;
at least one second insulating layer disposed over the flexible substrate; and
at least one wire over the at least one second insulating layer, wherein the at least one wire crosses the first opening pattern.

15. The display device of claim 14, further comprising at least one third insulating layer over the at least one wire.

16. A display device, comprising:
a flexible substrate configured to be bent in a first direction;
at least one first insulating layer disposed over the flexible substrate and including a first opening pattern that extends in a second direction crossing the first direction, wherein the at least one first insulating layer includes a first portion and a second portion that are spaced apart from each other, and wherein the first opening pattern is interposed between the first portion and the second portion; and
at least one second insulating layer disposed over the flexible substrate,
wherein at least one of the first and second insulating layers includes a second opening pattern extending in the first direction, and
wherein the second opening pattern crosses the first opening pattern.

17. The display device of claim 16, wherein the second opening pattern is adjacent to an edge of the flexible substrate.

18. The display device of claim 16, wherein the second opening pattern comprises a plurality of second sub-opening patterns spaced apart from each other in the second direction.

19. A display device, comprising:
a flexible substrate configured to be bent;
at least one first insulating layer disposed over the flexible substrate and including a first opening pattern;
at least one second insulating layer disposed over the at least one first insulating layer and including a portion that is disposed in the first opening pattern and contacts the flexible substrate; and
at least one wire over the at least one second insulating layer, wherein the at least one wire crosses the first opening pattern.

20. The display device of claim 19, wherein the at least one second insulating layer includes a groove corresponding to the first opening pattern.

21. The display device of claim 19, wherein the at least one first insulating layer includes an inorganic material, and wherein the at least one second insulating layer includes an organic material.

22. A display device, comprising:
a flexible substrate configured to be bent in a first direction;
a first insulating layer disposed over the flexible substrate and including a first opening pattern that extends in a second direction crossing the first direction; and
a second insulating layer disposed over the first insulating layer and including a portion disposed in the first opening pattern,
wherein the first opening pattern comprises a plurality of second sub-opening patterns overlapping in a depth direction of the flexible substrate.

* * * * *